United States Patent
Chen et al.

(10) Patent No.: US 7,361,601 B2
(45) Date of Patent: Apr. 22, 2008

(54) CHEMICAL MECHANICAL POLISH PROCESS AND METHOD FOR IMPROVING ACCURACY OF DETERMINING POLISH ENDPOINT THEREOF

(75) Inventors: Chun-Fu Chen, Hsinchu (TW); Chi-Tung Huang, Hsinchu (TW); Yung-Tai Hung, Hsinchu (TW); Chun-Chung Huang, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 11/160,357

(22) Filed: Jun. 21, 2005

(65) Prior Publication Data

US 2006/0283838 A1 Dec. 21, 2006

(51) Int. Cl.
*H01L 21/461* (2006.01)

(52) U.S. Cl. .............. 438/692; 438/720; 438/724; 356/30; 356/38; 356/328; 356/390; 451/6

(58) Field of Classification Search .......... 356/30, 356/38; 438/692, 720; 451/6
See application file for complete search history.

(56) References Cited

U.S. PATENT DOCUMENTS

| | | | |
|---|---|---|---|
| 6,153,116 A | 11/2000 | Yang et al. | 216/85 |
| 6,280,289 B1 | 8/2001 | Wiswesser et al. | 451/6 |
| 6,287,879 B1 * | 9/2001 | Gonzales et al. | 438/16 |
| 6,476,921 B1 | 11/2002 | Saka et al. | 356/630 |
| 6,652,355 B2 | 11/2003 | Wiswesser et al. | 451/6 |
| 2003/0190864 A1 * | 10/2003 | Lehman et al. | 451/5 |

OTHER PUBLICATIONS

S. Wolf, Silicon Processing for VLSI Era, vol. 4, Lattice Press (2002), pp. 385-389.*

* cited by examiner

*Primary Examiner*—Shamim Ahmed
*Assistant Examiner*—Maki Angadi
(74) *Attorney, Agent, or Firm*—Jianq Chyun IP Office (57) ABSTRACT

A method for improving accuracy of determining polish endpoint of chemical mechanical polish (CMP) process is provided. The method is performed before the CMP process. First, a test wafer with a to-be-polished layer and a material layer under the to-be-polished layer is provided. Then, a test beam with a wavelength is provided to irradiate the test wafer. The CMP process is performed to the test wafer to remove the to-be-polished layer until the material layer is exposed while the reflection of the test beam during the polish process is continuously detected. The reflection tendency is detected when the to-be-polished layer is to be completely removed and when the CMP process reaches the interface between the to-be-polished layer and the material layer. If the reflection tendency is gradually weakened, the test beam with the wavelength is chosen for the subsequent polish process.

21 Claims, 5 Drawing Sheets

CHEMICAL MECHANICAL POLISH PROCESS AND METHOD FOR IMPROVING ACCURACY OF DETERMINING POLISH ENDPOINT THEREOF

BACKGROUND OF THE INVENTION

1. Field of the Invention

The present invention relates to a chemical mechanical polish (CMP) process, and more particularly, to a CMP process and a method for improving accuracy of determining a polish endpoint thereof.

2. Description of the Related Art

With advance of semiconductor technology, number of transistors which can be fabricated in a chip per unit area is increased. The higher the device integrity is, the more the unplanar surface of a chip is undesirable. As a result, enhancing surface planarization of a chip becomes essentially important. A chemical mechanical polish (CMP) process is a method to provide a uniform surface planarization, and has become a vital thin film planarization technique for deep sub-micron technology.

Figure 1A:
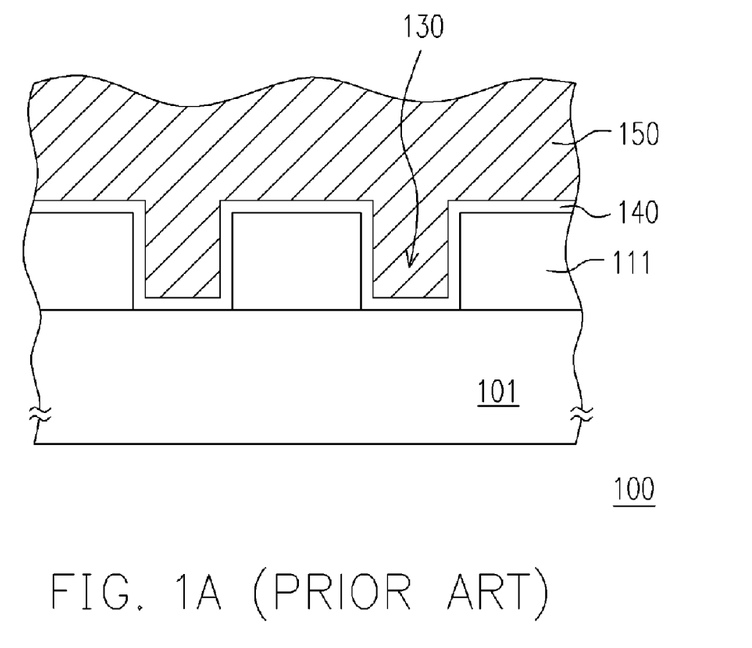
FIG. 1A is a cross sectional view of a prior art metal interconnect structure.

Use the commonly applied tungsten plug CMP process as an example. FIG. 1A is a cross sectional view of a prior art metal interconnect structure. The silicon oxide layer 111 is formed on the substrate 101 of the chip 100. The silicon oxide layer 111 comprises the opening 130. The adhesion layer 140 covers the silicon oxide layer 111. The material of the adhesion layer 140 can be, for example, titanium nitride/titanium (TiN/Ti). The conductive layer 150 is formed over the adhesion layer 140. The material of the conductive layer 150 can be, for example, tungsten. The opening 130 serves as a contact hole. The adhesion layer 140 and the conductive layer 150 filled in the opening 130 serve as a conductive plug. Since conductive lines are formed on the surface of the silicon oxide layer 111 to connect with the conductive plugs, the adhesion layer 140 and the conductive layer 150 over the surface of the silicon oxide layer 111 should be removed by a CMP process.

In order to avoid residues, dishing, or erosion resulting from under-polish or over-polish by the CMP process, how to accurately detect polish endpoints of the CMP process becomes an important topic in this field. For the presently used method of determining the polish endpoint, an IR light irradiates the conductive layer 150 while the to-be-polished layer, e.g., the conductive layer 150 and the adhesion layer 140 of FIG. 1A, is polished by the CMP process. The reflection of the IR light from the to-be-polished layer is continuously detected. Most of the material of the to-be-polished layer contains metal, and the silicon oxide layer 111 is non-metal. Accordingly, the reflection of the IR light from the to-be-polished layer is much stronger than that from the silicon oxide layer 111. When the reflection is weakened, it can be determined that the to-be-polished layer is removed and the surface of the silicon oxide layer 111 is exposed. At this moment, it also indicates the polish endpoint of the CMP process.

In another aspect, since the device integrity is increased due to advance of semiconductor technology, the high device integrity reduces line width and increases difficulty for photolithographic process. As a result, the misalignment issue is easy to happen. The issue becomes serious when a reflective layer, such as a metal layer or a polysilicon layer, is included in the structure. The reflective layer results in reflection of incident light on the film surface and diffraction. Thus, the photolithographic pattern may be incorrectly transferred. To prevent the issue described above, an anti-reflection coating (ARC) layer or a dielectric anti-reflection coating layer (DARC) layer is formed on the film layer to reduce the errors caused by the reflection during the photoresist exposure step, and to enhance device yield.

Figure 1B:
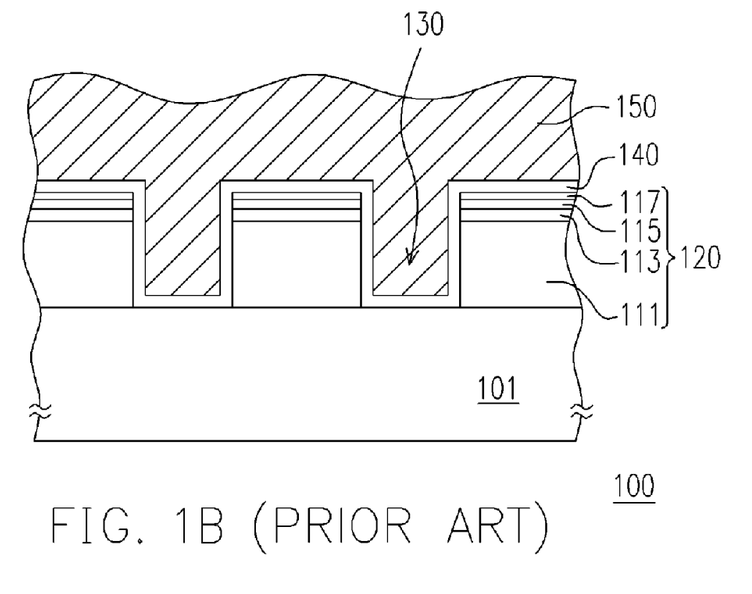
FIG. 1B is a cross sectional view of another prior art metal interconnect structure.

Though the ARC layer or the DARC layer is necessary for the photolithographic process, a new issue arises. During the CMP planarization process, the layer that should be polished is the material layer 120 of FIG. 1B, rather than the original single silicon oxide layer 111. The material layer 120 comprises, for example, the silicon oxide layer 111, the first DARC layer 113, the second DARC layer 115 and the cap oxide layer 117, which are sequentially formed on the substrate 101. These film layers enhance reflection of the IR light, which becomes irregular from the original reflection. With reducing the thickness of the to-be-polished layer, the reflection of IR light is enhanced and reflection variation becomes severe. This phenomenon may make the polish endpoint detection failed. If the film layers are under-polished, the residue of the material layer 120 may be generated on the conductive layer 150, causing bridge. In contrast, if the film layers are over-polished, the material layer 120 may be eroded. The material layer 120 may become thinner, and the conductive layer 150 is also subject to the over-polish. In a high-density device, the dielectric material among the metal interconnect structure is not sufficient to serve electrical isolation so as to affect device operation.

SUMMARY OF THE INVENTION

Accordingly, the present invention is directed to a chemical mechanical polish (CMP) process and a method for improving accuracy of determining a polish endpoint thereof. These methods avoid the issue caused by variations of reflection, and enhance detecting polish endpoints of the CMP process.

The present invention provides a method for improving accuracy of determining a polish endpoint of a chemical mechanical polish (CMP) process. The method is performed before the CMP process. The method comprises the following steps: (a) providing a test wafer, a to-be-polished layer and a material layer thereunder being formed over the test wafer; (b) providing a test beam with a wavelength to irradiate the test wafer; (c) performing a CMP process to the test wafer to remove the to-be-polished layer until exposing the material layer while continuously detecting a reflection of the test beam during the CMP process; and (d) determining a reflection tendency of the test beam when the to-be-polished layer is to be completely removed and when the CMP process reaches an interface between the to-be-polished layer and the material layer; if the reflection tendency is enhanced, steps (a)-(d) will be repeated, another test wafer and another test beam with another wavelength are provided until the reflection is weakened.

According to the method for improving accuracy of determining a polish endpoint of a chemical mechanical polish (CMP) process of an embodiment of the present invention, the test beam with the wavelength described above is provided by a CMP equipment with a single wavelength. The test beam with the wavelength described above can be also provided by a CMP equipment with multiple wavelengths.

According to the method for improving accuracy of determining a polish endpoint of a chemical mechanical polish (CMP) process of an embodiment of the present invention, a reflection of the test beam when the to-be-polished layer is to be completely removed compared with a reflection of the test beam when the CMP process has not been performed is reduced by at least 0.17.

According to the method for improving accuracy of determining a polish endpoint of a chemical mechanical polish (CMP) process of an embodiment of the present invention, after the steps (a)-(d) are repeated, a plurality of sets of reflection data is obtained, and a test beam with a wavelength whose reflection decreases the most per unit time is chosen for a subsequent polish process.

According to the method for improving accuracy of determining a polish endpoint of a chemical mechanical polish (CMP) process of an embodiment of the present invention, a material of the to-be-polished layer can be metal, such as tungsten, titanium or copper.

According to the method for improving accuracy of determining a polish endpoint of a chemical mechanical polish (CMP) process of an embodiment of the present invention, the material layer described above comprises an anti-reflection coating (ARC) layer. In addition, the material layer described above comprises a dielectric anti-reflection coating (DARC) layer. The material of the DARC layer can be, for example, silicon nitride or silicon oxynitride. Additionally, the material layer described above further comprises a cap oxide layer.

The present invention provides a chemical mechanical polish (CMP) process. According to the CMP process, a plurality of wafers is provided, and a to-be-polished layer and a material layer thereunder are formed over each wafer. At least one wafer is selected, and a pre-polish step is performed to determine a test wavelength for detecting a polish endpoint. Wherein, during the pre-polish step the test wavelength is continuously used to test the wafer during the polish step until the to-be-polished layer is removed and the material layer is exposed. A reflection tendency is obtained by the determining wavelength. The reflection tendency is weakened when the to-be-polished layer is to be completely removed and the polish step reaches an interface between the to-be-polished layer and the material layer. The other wafers are polished and polish endpoints of the other wafers are detected by a test beam with the test wavelength.

According to the CMP process of an embodiment of the present invention, the pre-polish step comprises: (a) providing at least one of the wafers; (b) providing a test beam with a wavelength to the wafer; (c) performing the pre-polish step to the wafer to remove the to-be-polished layer until exposing the material layer while continuously detecting a reflection of the test beam during the CMP process; and (d) determining a reflection tendency of the test beam when the to-be-polished layer is to be completely removed and when the CMP process reaches an interface between the to-be-polished layer and the material layer; if the reflection tendency is enhanced, steps (a)-(d) will be repeated, another test wafer and another test beam with another wavelength are provided until the reflection is weakened.

According to the CMP process of an embodiment of the present invention, the test beam with the wavelength described above is provided by a CMP equipment with a single wavelength. In addition, the test beam with the wavelength described above can be also provided by a CMP equipment with multiple wavelengths.

According to the CMP process of an embodiment of the present invention, a reflection of the test beam when the to-be-polished layer is to be completely removed compared with a reflection of the test beam when the CMP process has not been performed is reduced by at least 0.17.

According to the CMP process of an embodiment of the present invention, after the steps (a)-(d) are repeated, a plurality of sets of reflection data is obtained, and a test beam with a wavelength whose reflection decreases the most per unit time is chosen for a subsequent polish process.

According to the CMP process of an embodiment of the present invention, a material of the to-be-polished layer described above can be metal, such as tungsten, titanium or copper. The material layer described above comprises a dielectric anti-reflection coating (DARC) layer. The material of the DARC layer can be, for example, silicon nitride or silicon oxynitride.

Before the polish process, the wavelength test is used to determine the desired test beam with the specific wavelength according to the present invention. The test beam with the specific wavelength is then used to test the endpoint of the subsequent CMP process. Even if multiple ARC layers are formed over the substrate, the polish endpoint of the CMP process can be accurately detected. The polish endpoint detection will not be affected by reflection variations even if deposition of other layers. Accordingly, the whole device can be fabricated without bridge or short issues. Reliability and product yield are thus enhanced.

The above and other features of the present invention will be better understood from the following detailed description of the preferred embodiments of the invention that is provided in communication with the accompanying drawings.

DESCRIPTION OF SOME EMBODIMENTS

Figure 2:
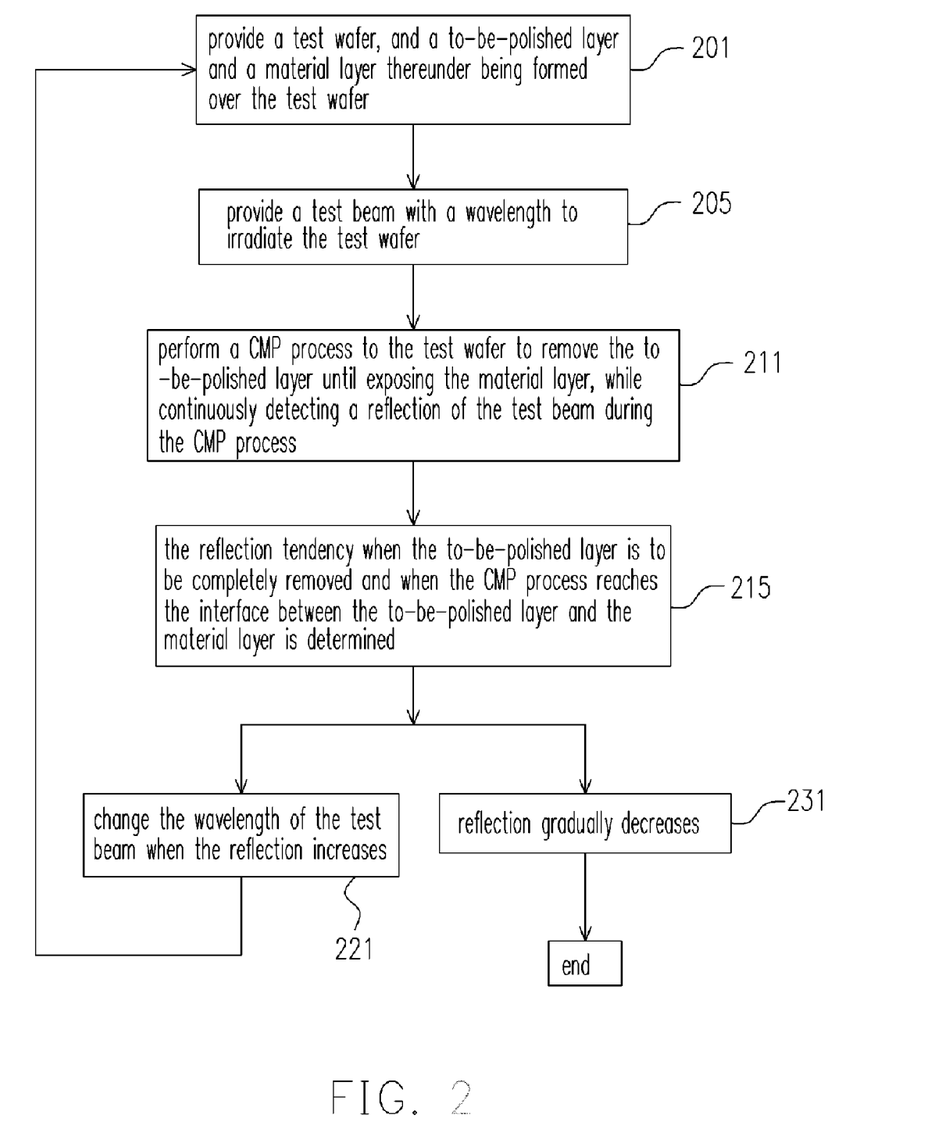
FIG. 2 is a flowchart showing a method for improving accuracy of determining a polish endpoint of a chemical mechanical polish (CMP) process according to an embodiment of the present invention.
Figure 3:
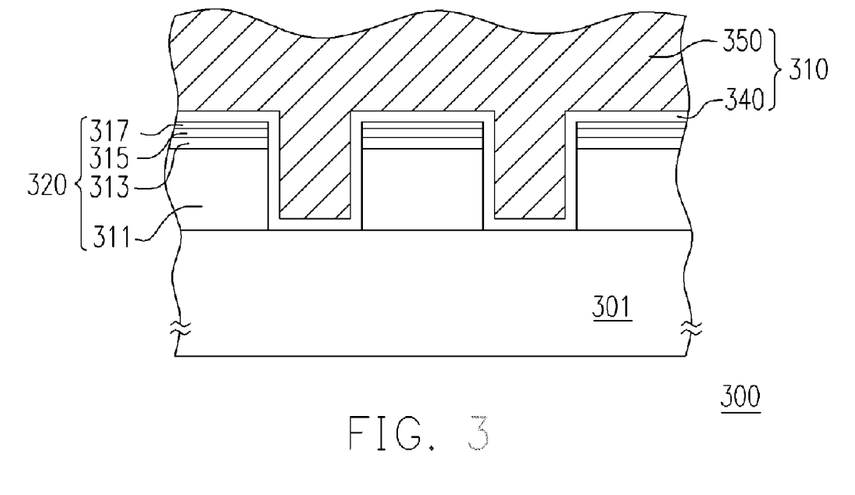
FIG. 3 is a cross sectional view of a test wafer according to an embodiment of the present invention.

The method for improving accuracy of determining the polish endpoint of the chemical mechanical polish (CMP) process is performed before the CMP process. Details are illustrated below. FIG. 2 is a flowchart showing a method for improving accuracy of determining a polish endpoint of a chemical mechanical polish (CMP) process according to an embodiment of the present invention. FIG. 3 is a cross sectional view of a test wafer according to an embodiment of the present invention.

Referring to FIGS. 2 and 3, a test wafer 300 is provided. A to-be-polished layer 310 and a material layer 320 under the to-be-polished layer 310 are formed over the test wafer 300 (step 201). The to-be-polished layer 310 comprises, for example, an adhesion layer 340 and a conductive layer 350. The material of the adhesion layer 340 can be, for example, titanium nitride/titanium (TiN/Ti). The material of the conductive layer 350 can be, for example, a conductive material, such as tungsten, copper, or nickel.

The material layer 320 may comprise the dielectric layer 311, the dielectric anti-reflection coating (DARC) layer 313, the anti-reflection coating (ARC) layer 315 and the cap oxide layer 317, which are formed sequentially over the substrate 301. The material of the DARC layer 313 can be, for example, silicon nitride, silicon oxynitride, silicon oxide or SixNy(OH)z. The material of the ARC layer 315 can be, for example, titanium, titanium nitride, titanium tungsten alloy, zinc selenide or other proper materials. In this embodiment, the to-be-polished layer 310 comprises the adhesion layer 340 and the conductive layer 350; the material layer 320 comprises the dielectric layer 311, the dielectric anti-reflection coating (DARC) layer 313, the anti-reflection coating (ARC) layer 315 and the cap oxide layer 317. In other embodiments, the to-be-polished layer 310 and the material layer 320 can be composed of different film layers or materials, depending on the requirement of the device. In addition, the DARC layer 313 and the ARC layer 315 are remaining layers by previous photolithographic and etch processes, for example.

Then, a test beam with a wavelength is provided to irradiate the test wafer 300 (step 205). The test wafer is polished by the CMP process to remove the to-be-polished layer 310 until the material layer 320 is exposed. Meanwhile, the reflection from the surface of the test wafer 300 (the surface of the to-be-polished layer 310) is continuously detected during the polish process (step 211).

Next, the reflection tendency when the to-be-polished layer 310 is to be completely removed and when the CMP process reaches the interface between the to-be-polished layer 310 and the material layer 320 is determined (step 215).

In order to enhance the accuracy of the photolithographic process, the film layer of the material layer 320 is not similar to that of the prior art dielectric layer 120. In this embodiment, the material layer 320 comprises, for example, the dielectric layer 311, the DARC layer 313, the ARC layer 315 and the cap oxide layer 317. Accordingly, the reflection tendency is enhanced with the polishing of the film layer when the test beam is applied to the test wafer 300. As a result, the reflection variation becomes severe, and the polish endpoint is hard to be detected. If the reflection tendency is enhanced during such period, another test wafer and another test beam with another wavelength should be selected (step 221). Steps 201, 205, 211 and 215 are repeated with the test beam of new wavelength until the reflection tendency is weakened. The new test wafer should have the same structure as the original test wafer so that the desired wavelength can be found.

If the reflection tendency is weakened, the test beam with the wavelength is thus selected for detecting polish endpoints of the subsequent CMP process (step 231). In one embodiment, the reflection of the test beam when the to-be-polished layer is to be completely removed compared with a reflection of the test beam when the CMP process has not been performed is reduced by at least 0.17.

Note that the test beam with the gradually-reduced reflection tendency is apt to determine the polish endpoint of the CMP process. The more reduction of the reflection tendency, the easier the polish endpoint is detected. Accordingly, after multiple repetitions of steps 201, 205, 211 and 215, a plurality of sets of reflection data can be obtained. And the test beam with the wavelength whose reflection decreases the most per unit time is chosen for a subsequent polish process. Since the wavelength with the mostly reduced reflection per unit time is detected when the to-be-polished layer is going to be completely removed, the test beam with such wavelength is the most suitable wavelength to accurately detect the polish endpoint. Accordingly, the accuracy of determining the polish endpoint of the CMP process is improved.

Note that the test beam is provided by an optical equipment of the CMP equipment. The optical equipment may provide a beam with a specific wavelength. In this embodiment, another polish equipment which can provide a beam with another wavelength to change the wavelength of the test beam is required. In other embodiments, the optical equipment of the CMP equipment can provide test beams with different wavelengths. In such an embodiment, the change of the test beams with different beams for detecting the test beam with the desired wavelength can be performed in the same equipment.

Accordingly, before the polish process the wavelength test is performed to determine the test beam with the desired wavelength in the present invention. The test beam with the desired wavelength is then applied for detecting polish endpoints of the subsequent CMP polish. Thus, the accuracy of determining the endpoint of the CMP process is improved.

Figure 4:
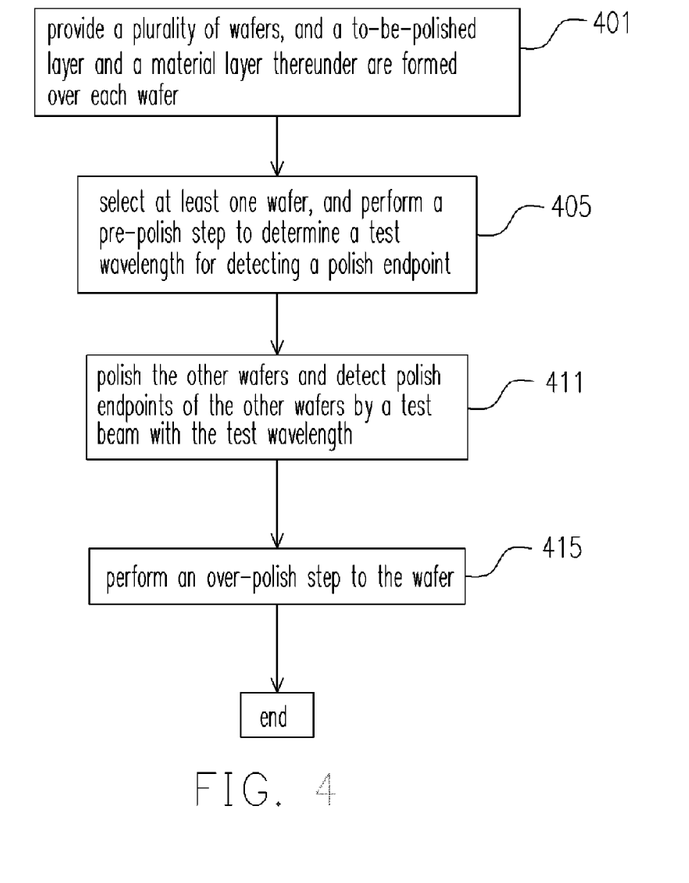
FIG. 4 is a flowchart showing a CMP process according to an embodiment of the present invention.

Following are descriptions of a CMP process with respect to the method for improving accuracy of determining the polish endpoint of the CMP process described above. Wherein, the CMP process is used for a process of forming contacts. FIG. 4 is a flowchart showing a CMP process according to an embodiment of the present invention.

Referring to FIG. 4, first a plurality of wafers is provided. The to-be-polished layer and the material layer under the to-be-polished layer are formed over each wafer (step 401). The to-be-polished layer comprises, for example, a conductive layer and an adhesion layer. The material of the conductive layer can be, for example, a conductive material, such as tungsten, copper, or nickel. The material of the adhesion layer 340 can be, for example, titanium nitride/titanium (TiN/Ti). The material layer may comprise the dielectric layer, the dielectric anti-reflection coating (DARC) layer, the anti-reflection coating (ARC) layer and the cap oxide layer, which are formed sequentially over the substrate. The material of the DARC layer can be, for example, silicon nitride, silicon oxynitride, silicon oxide or SixNy(OH)z. The material of the ARC layer can be, for example, titanium, titanium nitride, titanium tungsten alloy, zinc selenide or other proper materials. The structure of the wafer is referred to the cross sectional view of the test wafer shown in FIG. 3.

Then, at least one wafer is selected, and a pre-polish step is performed to determine a test wavelength for detecting a polish endpoint (step 405). Wherein, during the pre-polish step the test wavelength is continuously used to test the wafer during the polish step until the to-be-polished layer is removed and the material layer is exposed. A reflection tendency is obtained by the determining wavelength. The reflection tendency is gradually weakened when the to-be-polished layer is to be completely removed and the polish step reaches an interface between the to-be-polished layer and the material layer. The pre-polish step is the method for improving the accuracy of determining the polish endpoint of the CMP process described in the last embodiment. In other words, the step 405 comprises all the steps described above. The only difference between the last embodiment and this embodiment is that the test wafer 100 of last embodiment is replaced with the wafer in this embodiment. Detailed descriptions for the step 405 are not repeated.

Then, the other wafers are polished and polish endpoints of the other wafers are detected by the test beam with the test wavelength (step 411). Note that before step 411, the wavelength test is performed to determine the test beam with the desired wavelength (step 405). The test beam with the desired wavelength is then used to perform step 411 so that the accuracy of polish endpoints can be improved. In addition, after the polish endpoint is detected, an over-polish step 415 may be performed to remove residues of the to-be-polished layer on the material layer, which may cause bridges.

Accordingly, before the CMP process is performed to the wafer, the pre-polish process is performed to determine the test beam with the desired wavelength in the present invention. When the to-be-polished layer is removed, the reflection tendency of the test beam with the desired wavelength is severely weakened. The wavelength of the test beam which reduces the most serves as the wavelength of the beam for the subsequent CMP process. Even if multiple layers are formed under the to-be-polished layer, the polish endpoint of the CMP process still can be accurately detected. The endpoint detection will not be affected by reflection variations even if deposition of other layers. Accordingly, the whole device can be fabricated without bridge or short issues. Reliability and product yield are thus enhanced.

Figure 5:
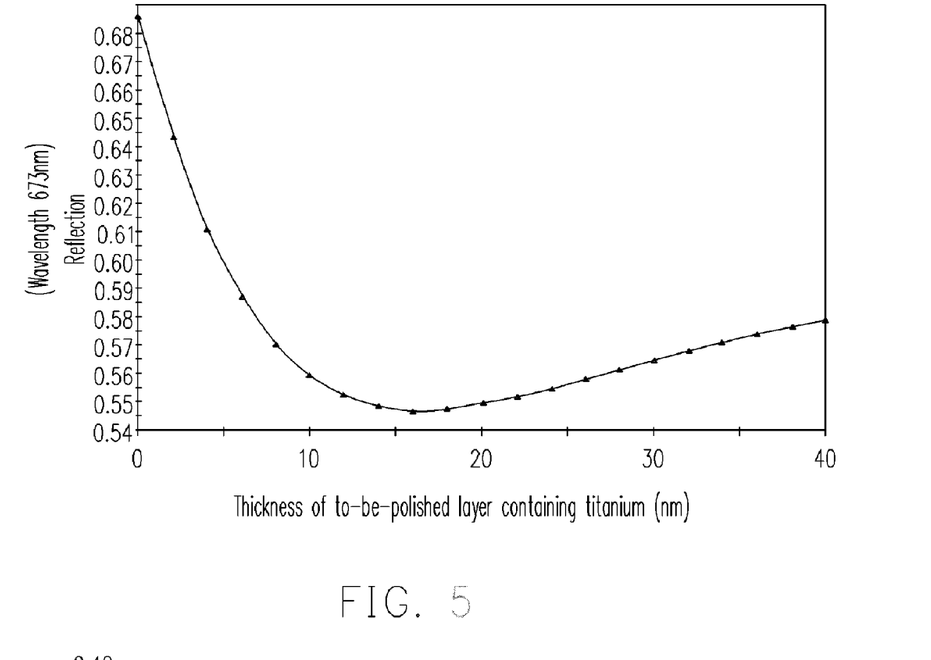
FIG. 5 is a schematic drawing showing a relationship between the thickness of a to-be-polished layer containing titanium and the reflection of a 637-nm light according to an embodiment of the present invention.
Figure 6:
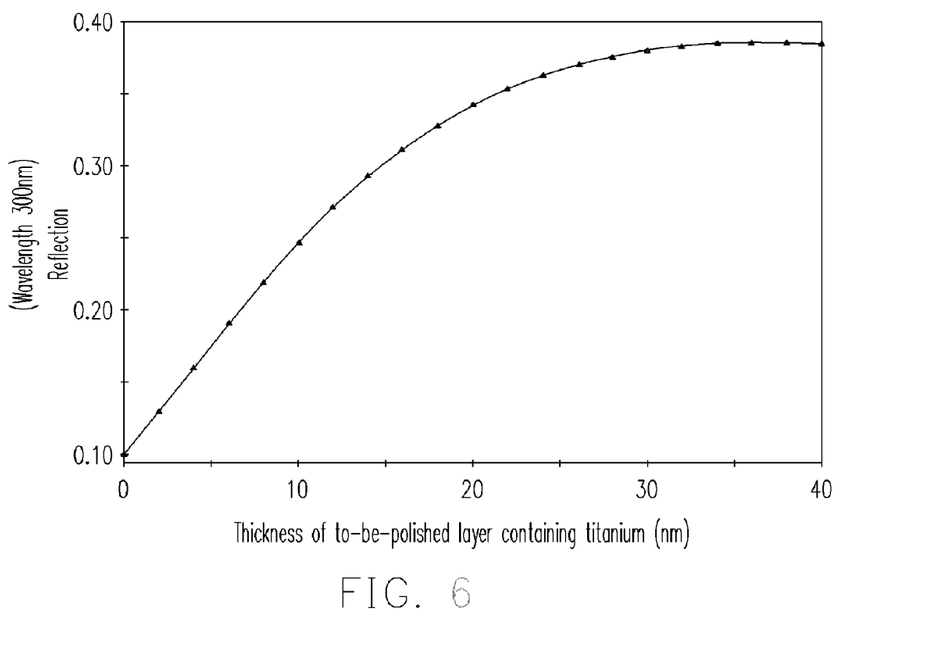
FIG. 6 is a schematic drawing showing a relationship between the thickness of a to-be-polished layer containing titanium and the reflection of a 300-nm light according to an embodiment of the present invention.
Figure 7:
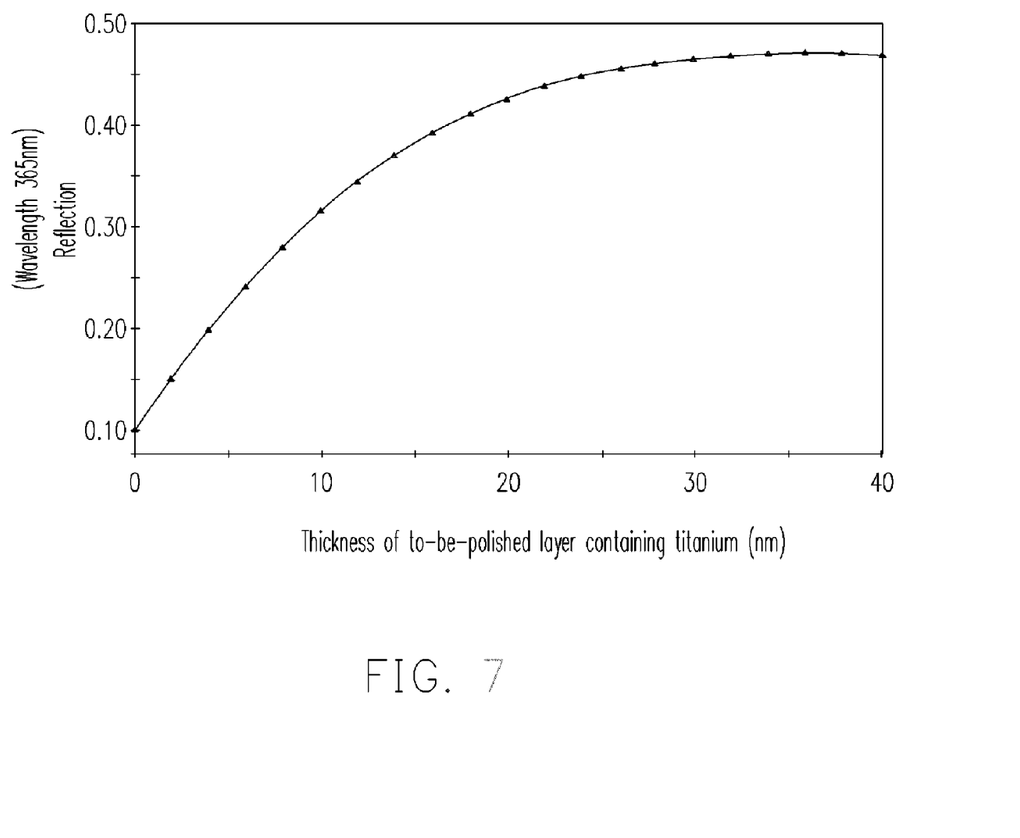
FIG. 7 is a schematic drawing showing a relationship between the thickness of a to-be-polished layer containing titanium and the reflection of a 365-nm light according to an embodiment of the present invention.

Additionally, in an embodiment the to-be-polished layer of the wafer can be, for example, a film layer containing titanium. The material layer under the to-be-polished layer comprises, for example, two DARC layers. During the pre-polish step, when a 673-nm IR light irradiates the wafer, the reflection of the IR light is shown in FIG. 5. When the thickness of the titanium-containing film layer nearly reaches 0 nm, the reflection of the light will increase. When lights with other wavelengths, such as 300 nm and 365 nm, are chosen, the reflections of the lights are shown in FIGS. 6 and 7, respectively. When the thickness of the titanium-containing film layer nearly reaches 0 nm, the reflection of the light will apparently decrease. Therefore, the lights with 300-nm or 365-nm wavelength are more suitable to be used for detecting the endpoint of the CMP process, compared with the 673-nm light. Accordingly, before the polish process, the method of the present invention is used to determine the test beam with the desired wavelength for subsequent polish process.

Although the present invention has been described in terms of exemplary embodiments, it is not limited thereto. Rather, the appended claims should be constructed broadly to include other variants and embodiments of the invention which may be made by those skilled in the field of this art without departing from the scope and range of equivalents of the invention.

What is claimed is:

1. A method for improving accuracy of determining a polish endpoint of a chemical mechanical polish (CMP) process, comprising:
   (a) providing a first test wafer, a to-be-polished layer and a material layer thereunder being formed over the first test wafer;
   (b) providing a first test beam with a first wavelength to irradiate the first test wafer;
   (c) performing a CMP process to the first test wafer to remove the to-be-polished layer until exposing the material layer while continuously detecting a reflection of the first test beam during the CMP process; and
   (d) determining a reflection tendency of the first test beam when the to-be-polished layer is to be completely removed and when the CMP process reaches an interface between the to-be-polished layer and the material layer, if the reflection tendency of the first test beam is decreased, detecting polish endpoints of the other wafers by the first test beam with the first test wavelength and if the reflection tendency of the first test beam is increased, steps (a)-(d) being repeated, second test wafer and second test beam with second wavelength being provided until the reflection tendency is decreased, wherein the first wavelength and the second wavelength are different, and the CMP process to the first test wafer and the CMP process to the second test wafer are preformed under a same condition.

2. The method for improving accuracy of determining a polish endpoint of a chemical mechanical polish (CMP) process of claim 1, wherein the first test beam with the first test wavelength and the second test beam with the second test wavelength are provided by a CMP equipment with a single wavelength, respectively.

3. The method for improving accuracy of determining a polish endpoint of a chemical mechanical polish (CMP) process of claim 1, wherein the first test beam with the first test wavelength and the second test beam with the second test wavelength are provided by a CMP equipment with multiple wavelengths.

4. The method for improving accuracy of determining a polish endpoint of a chemical mechanical polish (CMP) process of claim 1, wherein a reflection of the first test beam when the to-be-polished layer is to be completely removed compared with a reflection of the first test beam when the CMP process has not been performed is reduced by at least 0.17.

5. The method for improving accuracy of determining a polish endpoint of a chemical mechanical polish (CMP) process of claim 1, wherein after repeating the steps (a)-(d), a plurality of sets of reflection data are obtained, and a test beam with a wavelength whose reflection decreases the most per unit time is chosen for a subsequent polish process.

6. The method for improving accuracy of determining a polish endpoint of a chemical mechanical polish (CMP) process of claim 1, wherein a material of the to-be-polished layer comprises metal.

7. The method for improving accuracy of determining a polish endpoint of a chemical mechanical polish (CMP) process of claim 6, wherein the metal comprises tungsten, titanium or copper.

8. The method for improving accuracy of determining a polish endpoint of a chemical mechanical polish (CMP) process of claim 1, wherein the material layer comprises an anti-reflection coating (ARC) layer.

9. The method for improving accuracy of determining a polish endpoint of a chemical mechanical polish (CMP) process of claim 1, wherein the material layer comprises a dielectric anti-reflection coating (DARC) layer.

10. The method for improving accuracy of determining a polish endpoint of a chemical mechanical polish (CMP) process of claim 9, wherein a material of the DARC layer comprises silicon nitride or silicon oxynitride.

11. The method for improving accuracy of determining a polish endpoint of a chemical mechanical polish (CMP) process of claim 1, wherein the material layer comprises cap oxide layer.

12. A chemical mechanical polish (CMP) process, comprising:
    providing a plurality of wafers, a to-be-polished layer and a material layer thereunder being formed over each wafer;
    selecting at least one of the wafers as a first test wafer, and performing a pre-polish step to determine a test wavelength for detecting a polish endpoint, wherein the pre-polish step comprises:
    (a) providing a first test beam with a first wavelength to the first test wafer;
    (b) performing the pre-polish step to the first test wafer to remove the to-be-polished layer until exposing the material layer while continuously detecting a reflection of the first test beam during the CMP process; and
    (c) determining a reflection tendency of the first test beam when the to-be-polished layer is to be completely removed and when the CMP process reaches an interface between the to-be-polished layer and the material layer; if the reflection tendency is increased, steps (a)-(c) being repeated, second test wafer and second test beam with second wavelength being provided until the reflection tendency is decreased, wherein the first wavelength and the second wavelength are different, and the CMP process to the first test wafer and the CMP process to the second test wafer are preformed under a same condition;
    polishing the other wafers and detecting polish endpoints of the other wafers by a test beam with the test wavelength that the reflection tendency is decreased.

13. The chemical mechanical polish (CMP) process of claim 12, wherein the first test beam with the first wavelength and the second test beam with the second test wavelength are provided by a CMP equipment with a single wavelength, respectively.

14. The chemical mechanical polish (CMP) process of claim 12, wherein the first test beam with the first wavelength and the second test beam with the second test wavelength are provided by a CMP equipment with multiple wavelengths.

15. The chemical mechanical polish (CMP) process of claim 12, wherein a reflection of the first test beam when the to-be-polished layer is to be completely removed compared with a reflection of the first test beam when the CMP process has not been performed is reduced by at least 0.17.

16. The chemical mechanical polish (CMP) process of claim 12, wherein after repeating the steps (a)-(c), a plurality of sets of reflection data are obtained, and a test beam with a wavelength whose reflection decreases the most per unit time is chosen for a subsequent polish process.

17. The chemical mechanical polish (CMP) process of claim 12, wherein a material of the to-be-polished layer comprises metal.

18. The chemical mechanical polish (CMP) process of claim 12, wherein the metal comprises tungsten, titanium or copper.

19. The chemical mechanical polish (CMP) process of claim 12, wherein the material layer comprises a dielectric anti-reflection coating (DARC) layer, and a material of the DARC layer comprises silicon nitride or silicon oxynitride.

20. The method for improving accuracy of determining a polish endpoint of a chemical mechanical polish (CMP) process of claim 1, wherein a material of the to-be-polished layer comprises metal; and the material layer comprises an anti-reflection coating (ARC) layer.

21. The method for improving accuracy of determining a polish endpoint of a chemical mechanical polish (CMP) process of claim 12, wherein a material of the to-be-polished layer comprises metal; and the material layer comprises a dielectric anti-reflection coating (DARC) layer.

* * * * *